US012394766B2

(12) United States Patent
Marcault et al.

(10) Patent No.: US 12,394,766 B2
(45) Date of Patent: Aug. 19, 2025

(54) ASSEMBLY OF SEMICONDUCTOR POWER MODULES

(71) Applicant: COMMISSARIAT A L'ENERGIE ATOMIQUE ET AUX ENERGIES ALTERNATIVES, Paris (FR)

(72) Inventors: Emmanuel Marcault, Grenoble (FR); Sarah Soulie, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 641 days.

(21) Appl. No.: 17/450,300

(22) Filed: Oct. 8, 2021

(65) Prior Publication Data

US 2022/0131459 A1 Apr. 28, 2022

(30) Foreign Application Priority Data

Oct. 26, 2020 (FR) .................................... 20 10945

(51) Int. Cl.
 H05K 7/20 (2006.01)
 H01L 25/11 (2006.01)
 (Continued)

(52) U.S. Cl.
 CPC ........... H01L 25/117 (2013.01); H02M 3/003 (2021.05); H02M 3/158 (2013.01); H05K 7/14329 (2022.08); H05K 7/209 (2013.01)

(58) Field of Classification Search
 CPC .. H05K 7/209; H05K 7/14329; H01L 23/467; H01L 23/552; H02M 3/003; H02M 3/158
 (Continued)

(56) References Cited

U.S. PATENT DOCUMENTS 5,608,610 A * 3/1997 Brzezinski .......... H01L 23/3675
257/E23.09
7,294,542 B2 * 11/2007 Okushima ........... H01L 27/0259
438/200

(Continued)

FOREIGN PATENT DOCUMENTS

| EP | 3 147 941 A1 | 3/2017 |
| EP | 3 621 106 A1 | 3/2020 |
| WO | WO 2018/024973 A1 | 2/2018 |

OTHER PUBLICATIONS

French Preliminary Search Report issued Jul. 7, 2021 in French Application 20 10945 filed on Oct. 26, 2020, 4 pages (with English Translation of Categories of Cited Documents).

(Continued)

*Primary Examiner* — Tuan T Dinh
(74) *Attorney, Agent, or Firm* — Oblon, McClelland, Maier & Neustadt, L.L.P.

(57) ABSTRACT

An assembly includes power modules, each power module having at least a first and a second component disposed one on top of the other on either side of the substrate. Each component has at least two power contacts. A first connection element is electrically connected to a first power contact of the first component and to a first power contact of the second component, a second connection element is electrically connected to a second power contact of the first component, and a third connection element is electrically connected to a second power contact of the second component. The first connection elements of the modules are disposed on the same side of the assembly, the second connection elements of the modules are disposed on the same side of the assembly, and the third connection elements of the modules are disposed on the same side of the assembly.

27 Claims, 9 Drawing Sheets

(51) Int. Cl.
   *H02M 3/00*   (2006.01)
   *H02M 3/158*  (2006.01)
   *H05K 7/14*   (2006.01)

(58) Field of Classification Search
   USPC ........ 361/700–710, 770–790, 795, 803, 813; 257/690–710
   See application file for complete search history.

(56) References Cited

U.S. PATENT DOCUMENTS

| | | | | |
|---|---|---|---|---|
| 7,529,070 | B2 * | 5/2009 | Bhattacharya | H01L 27/0266 361/111 |
| 8,010,927 | B2 * | 8/2011 | Gauthier, Jr. | G06F 30/30 716/109 |
| 9,041,183 | B2 | 5/2015 | Liang et al. | |
| 10,685,900 | B2 * | 6/2020 | Singh | F28D 20/023 |
| 2008/0224303 | A1 * | 9/2008 | Funakoshi | H01L 23/473 257/E23.088 |
| 2009/0116197 | A1 | 5/2009 | Funakoshi | H01L 21/4882 438/122 |
| 2010/0065950 | A1 * | 3/2010 | Lowry | H01L 23/49844 257/E23.08 |
| 2011/0316143 | A1 * | 12/2011 | Noritake | H01L 23/473 257/713 |
| 2013/0050947 | A1 * | 2/2013 | Kadoguchi | H01L 23/4334 29/592.1 |
| 2015/0035170 | A1 | 2/2015 | Nikitin et al. | |
| 2015/0287665 | A1 * | 10/2015 | Hanada | H01L 25/07 257/691 |
| 2015/0289410 | A1 * | 10/2015 | Salat | H05K 7/20263 361/699 |
| 2016/0308481 | A1 | 10/2016 | Lei et al. | |
| 2017/0197511 | A1 * | 7/2017 | Yonak | B60L 50/61 |
| 2018/0254235 | A1 * | 9/2018 | Tsuyuno | H01L 23/3121 |
| 2018/0301444 | A1 * | 10/2018 | Roth | H01L 25/16 |
| 2018/0332739 | A1 * | 11/2018 | Takeuchi | H01L 23/473 |
| 2019/0208659 | A1 * | 7/2019 | Singh | H02M 7/003 |
| 2019/0295990 | A1 * | 9/2019 | Hayashi | H01L 23/36 |
| 2019/0335628 | A1 * | 10/2019 | Lei | H05K 7/20872 |
| 2020/0035656 | A1 * | 1/2020 | Miyazaki | H01L 24/40 |
| 2020/0152547 | A1 * | 5/2020 | Alawieh | F28D 15/04 |
| 2021/0151416 | A1 | 5/2021 | Niu et al. | |

OTHER PUBLICATIONS

Fita et al., "Perturbations électromagnétiques conduites d'un bras d'onduleur à base de transistors en Nitrure de Galium: Structure" 3D "pour composants horizontaux" (Electromagnetic interference flowing from an inverter arm based on Gallium Nitride transistors: 3D structure for horizontal components) Symposium de Génie Electrique, Jun. 2016, 9 pages.

* cited by examiner

ASSEMBLY OF SEMICONDUCTOR POWER MODULES

The present invention relates to semiconductor power modules, such as those used for switching high currents.

PRIOR ART

Certain power modules comprise two transistors associated according to a half-bridge configuration, with terminals to be connected to a DC bus and an output corresponding to one phase, intended to be connected to equipment such as an electrical rotating machine for example. A decoupling capacitor is connected between the terminals of the DC bus. Terminals are also provided for the connection to a control or 'driver' circuit for the transistors.

Depending on the number of phases of the equipment to be powered or of the power to be switched, several power modules may be used, which are connected in parallel in this case.

The development of transistors based on Gallium Nitride has allowed the operating frequencies to be increased, which renders the stray inductances associated with connections within the module critical.

Today, the majority of the power modules have power interconnections placed side-by-side in the same plane. The resulting switching mesh is lateral, which tends to increase the stray inductances in the circuit.

In the publication: "*Perturbations électromagnetiques conduites d'un bras d'onduleur à base de transistors en Nitrure de Gallium: Structure "3D" pour composants horizontaux*" (Electromagnetic interference flowing from an inverter arm based on Gallium Nitride transistors: 3D structure for horizontal components), Clement Fita et al., Symposium de Génie Electrique, June 2016, Grenoble, France, the idea is to reduce the stray inductances by vertically superposing, according to a mirror arrangement, the transistors of the half-bridge on either side of a substrate formed by a multilayer printed circuit. Holes are formed in the printed circuit for placing the decoupling capacitors as close as possible to the transistors. The power connection between the transistors is provided by tracks internal to the substrate, and this results in a relatively complex structure, in which the substrate cannot have a simple role of mechanical support and of heat dissipation.

The authors point out that the drawback of such a structure where the transistors are intended to be cooled via the underside, i.e. via the printed circuit, is the difficulty of dissipating the heat generated by the transistors, since the thermal losses are intended to be evacuated via the printed circuit and each transistor thus interferes with the dissipation of the thermal losses from the opposing transistor, given their mirror configuration.

The application WO 2018/024973 A1 describes a method for fabricating a three-dimensional power module, comprising the assembly of two substrates each accommodating a power component.

The application U.S. Pat. No. 9,041,183 B2 describes a power module in which the power components are disposed centrally between two substrates. Such a structure is not entirely satisfactory as regards the dissipation of the thermal losses, the dissipation being effected through the substrates.

DESCRIPTION OF THE INVENTION

Equipment supplied by the power modules usually has several phases or is controlled by modules configured in parallel, and there exists a need for an assembly of multiphase modules or modules connected in parallel, which are both compact and optimized with respect to the heat dissipation, while at the same time minimizing the stray inductances.

SUMMARY OF THE INVENTION

The invention aims to meet this need, and it achieves this, according to a first of its aspects, by providing an assembly of power modules, comprising at least two superposed power modules, each power module comprising:

An electrically insulating substrate, having opposing main faces, at least a first and a second semiconductor component, disposed one on top of the other on either side of the substrate and resting on its main faces, each component having at least two power contacts, a first connection element electrically connected to a first power contact of the first component and to a first power contact of the second component, a second connection element electrically connected to a second power contact of the first component, a third connection element electrically connected to a second power contact of the second component, the first connection elements of the modules being disposed on the same side of the assembly, the second connection elements of the modules being disposed on the same side of the assembly, the third connection elements of the modules being disposed on the same side of the assembly.

Within each module, the substrate forms a central support which participates in the mechanical fixing of the power components of the module, together with the connection elements.

Such an assembly of modules represents a compact arrangement which can be efficiently cooled.

The assembly also has a modular configuration which readily allows the number of superposed modules to be increased or decreased depending on the number of phases of the equipment used or on the current requirements.

The first connection element allows, by connecting the component situated on the upper face of the substrate to that situated on the lower face of the substrate, a short mesh and a low stray impedance for the module in question to be obtained. Each module may thus exhibit a stray mesh inductance of less than 5 nH, for example of the order of 2 nH, whereas those in a usual half-bridge of the prior art are typically of the order of 10 nH.

Each component may comprise at least one control contact, for example a gate contact for a transistor, each module comprising at least two output terminals, notably output terminals defined by connectors carried by the module, for electrically connecting the control contacts of the power components to a driver circuit, all the output terminals, notably all the connectors, being situated on the same side of the module, and all the connectors preferably being situated on the same side of the assembly of modules.

The invention allows the imbalance between the controls of the various modules to be limited owing to the different lengths of conductors, and thus the noise to be limited. The fact that the connections to the driver circuit may be made on the same side for all the modules of the assembly facilitates the connection in parallel of the modules or the multi-phase.

The substrate can contribute to the heat dissipation by being advantageously made from a material with a good thermal conductivity, such as a ceramic.

The invention lends itself to an operation at high temperature, and is applicable to motor control, to space applications, to aeronautics, or to drilling, amongst other applications. The maximum current switched by the assembly of modules is for example greater than or equal to 100 A, in particular when the modules of the assembly are electrically connected in parallel. The power components (again sometimes referred to as "chips") are preferably transistors based on GaN. These power components may be encapsulated or otherwise, and generally have at least two power contacts (for example Source and Drain) and one control contact (for example Gate). On one face, they may also have a thermal pad, designed to be thermally connected to a heat sink. Preferably, this thermal pad is on the side opposite to the substrate. Examples of transistors based on GaN are provided under the trademark $GaN_{PX}$ by the company GaN Systems.

The second and third connection elements may define terminations designed to be connected to the terminals of a DC bus, whereas the first connection elements define phase terminals, which could be connected together when the power modules are connected in parallel.

Preferably, for each power module, the first connection element electrically connects together the first power contact of the first component (for example the Source) and the first power contact of the second component (for example the Drain), outside of the substrate. This may contribute to simplifying the substrate, which does not have to integrate power electrical tracks, and allows a material with a good thermal conductivity such as a ceramic to be used to form the substrate.

Preferably, each substrate has an opening and each power module comprises a decoupling capacitor extending at least partially through this opening, being electrically connected to a power contact of one of the components of the module and to a power contact of the other component of the module. This allows the stray inductances to be further reduced. The value of the capacitance is for example from 3 to 5 nF per amp switched. Preferably, the decoupling capacitor is situated facing the second and third connection elements and at their contact, being for example soldered to the latter, preferably close to the power components.

The substrate may be monolithic, being for example a ceramic, such as the aforementioned, notably a ceramic comprising aluminum nitride AN or alumina $Al_2O_3$.

Preferably, the substrate is fabricated with main faces not totally plane, having at least one re-entrant or protruding feature for positioning the power component present on the corresponding face, a cover and/or one of said connection elements.

Preferably, at least for the features ensuring the positioning of the power components, the substrate has a symmetrical shape with respect to a median plane of symmetry passing through it at half-thickness.

Each component may comprise at least one control contact (for example a Gate contact), each module comprising at least two output terminals, notably output terminals defined by connectors carried by the module, in order to electrically connect the control contacts of the power components to a driver circuit. All the output terminals, notably all the connectors, are advantageously situated on the same side of the module, and all the connectors are preferably situated on the same side of the assembly of modules. This allows the asymmetries in the control of the components to be limited by matching the lengths of the control conductors, the noise together with the stray inductances in the control to be reduced, and can facilitate the installation of a driver card near to the assembly of modules.

The first connection element may be formed by cutting out and folding a foil of a metal, preferably of copper.

For example, the first connection element comprises first and second branches laterally offset, extending from a junction part connecting the branches together, each branch being connected to the junction part via a first elbow substantially at a right angle, the first two elbows being directed in opposite directions, and each branch comprising a second elbow substantially at a right angle, in such a manner that the terminal portions of the first and second branches are substantially parallel, these terminal portions each being electrically connected to an electrical contact of a respective component.

Preferably, the first connection element comprises two superposed branches extending in contact with one another over a part of their length, then separated one from the other over the remainder of their length.

Preferably, the connection elements have parts which extend outside of the substrate and define electrical terminals.

Each module may comprise opposing covers, in thermal contact with the faces of the components opposite to the substrate. The substrate may have features which cooperate with complementary features in the covers in order to ensure the positioning of the covers on the substrate in a predefined configuration.

Preferably, the two components of each module are transistors connected together (for example the Source of one is connected to the Drain of the other) so as to form a half-bridge, but other arrangements are possible. The two components of each module are preferably identical, but as a variant they may be different, for example a diode and a transistor, with for example the diode on one face and the transistor on the other.

Preferably, the two components are transistors using a wide bandgap semiconductor such as gallium nitride (GaN).

In one exemplary embodiment, the assembly comprises at least one heat sink between two adjacent modules, notably a heat sink with fins. The fins may be formed in a monolithic manner with one of the aforementioned covers, or even with both covers designed to be mounted on adjacent modules. For example, the fins are made of metal or ceramic with one or two covers. The assembly may not comprise any housing or additional encapsulation extending around the substrates, which then remain exposed within the module assembly, on their periphery. Each module may comprise opposing covers, in thermal contact with respective faces of the components, opposite to the substrate.

The assembly may comprise at least three superposed modules, notably may only have three superposed modules, but the invention is not limited to a given number of superposed modules, and at least one redundant module may for example be provided.

Another subject of the invention, according to another of its aspects, independent of or in combination with the preceding aspect, is a power module taken in isolation, this power module comprising:

An electrically insulating substrate, having opposing main faces, at least a first and a second semiconductor component disposed one on top of the other on either side of the substrate and in contact with its main faces, each component having at least two power contacts, a first connection element electrically connecting together a first power contact of the first component and a first power contact of the second component, outside of the substrate, preferably a second connection element electrically connected to a second power contact of the first component, preferably a third connection element electrically connected to a second power contact of the second component.

Such a module may exhibit all or part of the features of the modules of the assembly defined hereinabove.

A further subject of the invention, according to another of its aspects, independent of or in combination with the preceding aspects, is a power module taken in isolation, this power module comprising:

An electrically insulating substrate, having opposing main faces, at least a first and a second semiconductor component disposed one on top of the other on either side of the substrate and in contact with its main faces, each component having at least two power contacts, a first connection element electrically connecting together a first power contact of the first component and a first power contact of the second component, at least two control connectors for the power components of the module, situated on the same side of the substrate, preferably with a plug-in direction substantially parallel to a median plane of the substrate passing through the latter at half-thickness, preferably a second connection element electrically connected to a second power contact of the first component, preferably a third connection element electrically connected to a second power contact of the second component.

Such a module may exhibit all or part of the features of the modules of the assembly defined hereinabove.

Yet another subject of the invention, independent of or in combination with the preceding subjects, is a substrate for the fabrication of a module of an assembly according to the first aspect of the invention such as defined hereinabove or of a power module according to one of the second or third aspects of the invention.

This substrate, which may advantageously be made from a ceramic, has two opposing main faces each defining an accommodation for receiving a respective power component such as a power transistor, an accommodation for a connection element connected to a power contact of the power component, an accommodation for another connection element connected to another power contact of the component, and at least one channel connected to a control contact of the power component, the channels for the control conductors opening out on the same side of the substrate, for the two faces of the substrate.

The substrate may have a generally rectangular shape, the accommodations receiving the connection elements connected to the power contacts preferably opening out on the small sides of the substrate and the channels receiving the conductors connected to the control contacts preferably opening out on the same large side of the substrate.

Preferably, the accommodations receiving the power components are symmetrical to each other with respect to a plane of symmetry passing through the substrate at half-thickness.

Preferably also, the accommodations receiving the connection elements in the power contacts of a power component situated on one face are symmetrical to those receiving the connection elements connected to the power contacts of the component situated on the other face, with respect to a plane of symmetry passing through the substrate at half-thickness.

In contrast, the channels situated on one face and receiving the conductors connected to the control connector of a component present on this face are preferably laterally offset with respect to the channels present on the other face and used to control the power component present on this other face, in such a manner as to facilitate the installation of the connectors.

The substrate may comprise features for positioning a cover on each of its faces, this cover serving as a heat sink coming into thermal contact with the power component facing it. The cover may, where appropriate, be fabricated with heat sink fins.

The substrate may be fabricated by an additive fabrication technique, and is notably made from a ceramic.

Yet another subject of the invention, according to another of its aspects, is a double cover comprising a first cover designed to be applied to a first substrate of a first power module and a second cover designed to be applied to a second substrate of a second power module, the first and second covers being rigidly attached, for example by being fixed face against face or by being connected via fins, which could be fabricated in a monolithic manner with at least one of the covers. Each cover may have positioning features designed to cooperate with corresponding features on the substrates against which it is designed to be applied, so as to be positioned in a predefined manner on the latter. The covers may have metal or metallized faces designed to come into thermal contact with the power components, via a sintering for example.

A further subject of the invention is an assembly formed from at least two power modules such as defined hereinabove, whose substrates are connected via such a double cover.

BRIEF DESCRIPTION OF THE DRAWINGS

The invention will be better understood upon reading the detailed description that follows of non-limiting exemplary embodiments of the latter, and upon examining the appended drawing, in which.

DETAILED DESCRIPTION

FIGS. 1 to 4 show one example of an assembly 1 of power modules 10 according to the invention.

Figure 5:
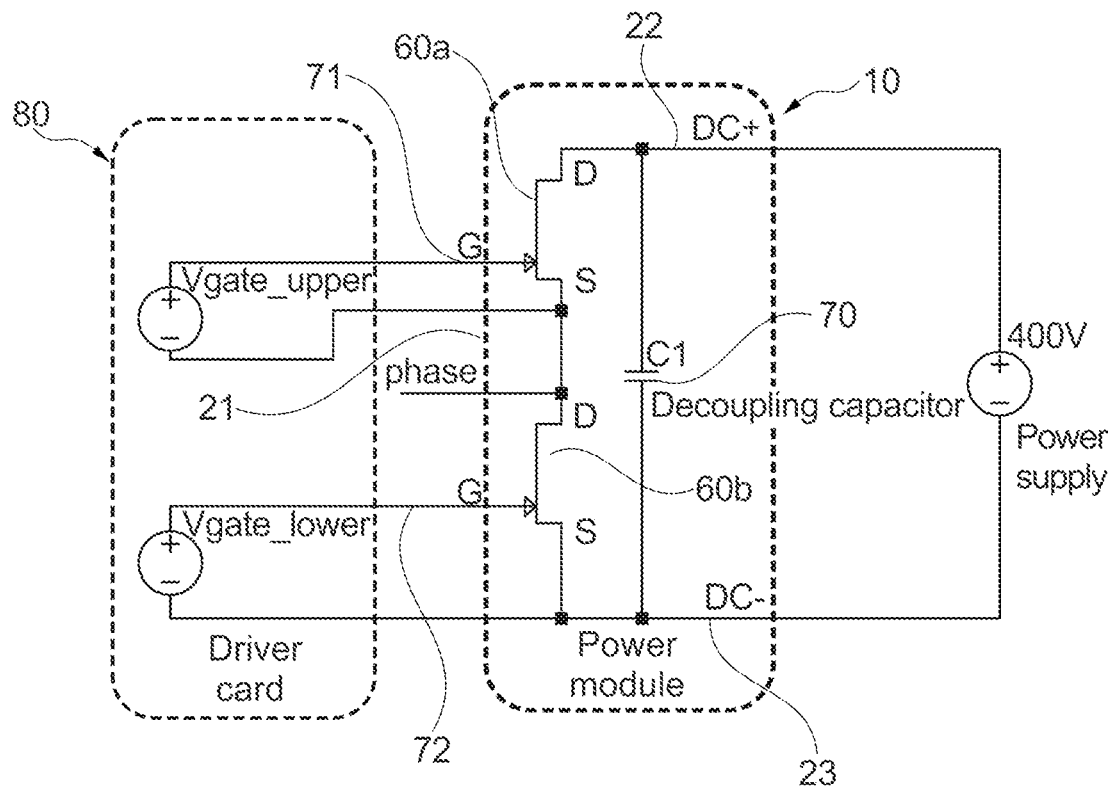
FIG. 5 is an electrical circuit diagram illustrating the connection of a module to the DC bus and to a driver circuit, together with the connections internal to the module.
Figure 14:
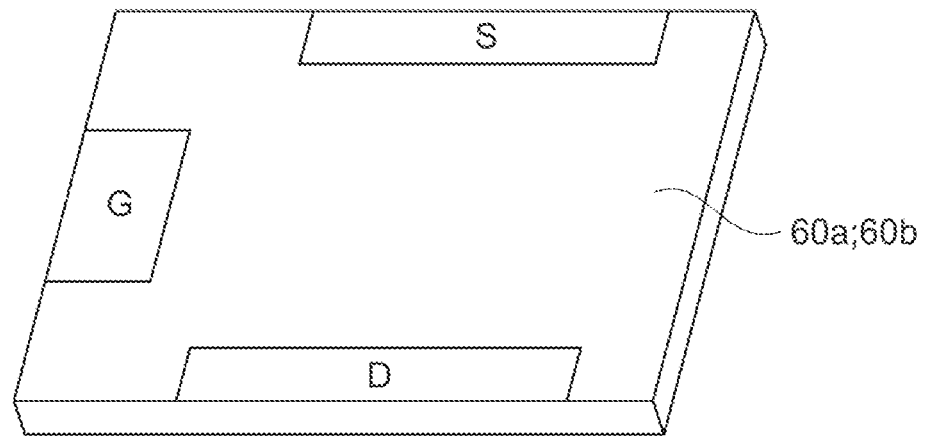
FIG. 14 shows a power transistor in isolation.

In the example being considered, this assembly comprises three modules 10 each comprising, as illustrated in FIG. 5, two power transistors 60a, 60b electrically connected according to an H-type half-bridge configuration, and a decoupling capacitor 70. FIG. 14 shows, in isolation, a power transistor 60a or 60b. It can be seen in this figure that the component may have a generally flat rectangular parallelepipedic shape, where the contacts S and D may be opposite to each other along the large sides of the rectangle (viewed from above), and the contact G on one of the small sides.

The assembly is for example designed to switch high currents at high frequencies, and the modules 10 are for example electrically connected in parallel. Thus, the assembly 1 may form a compact object containing several half-bridges in parallel, the number of half-bridges thus associated within the assembly 1 being for example chosen as a function of the total power to be switched. As a variant, the modules are not electrically connected in parallel at the output phases, for a multi-phase connection to the associated equipment, for example.

Each module 10 is designed to be connected to a DC bus DC+, DC−, the upper transistor 60a of the bridge having, in this example, its drain D connected to the terminal DC+ of the bus and the lower transistor 60b of the bridge having its source S connected to the terminal DC− of the bus. The source S of the upper transistor 60a of the bridge is connected to the drain of the lower transistor 60b of the bridge and to the phase output of the half-bridge.

The gates G of the transistors 60a, 60b are designed to be connected via connections 71 and 72 to a driver circuit 80.

The decoupling capacitor 70 is connected between the terminals DC− and DC+ of the bus.

Referring again to FIG. 1, it can be seen that each module 10 has, as seen from above, a generally rectangular shape, and that the terminals formed by the connection elements 22, 23 to be connected to the DC bus are situated of the same small side of the assembly 1, whereas the terminations of the connection elements 21 connected to the phases are situated on the side opposite the small side.

The connectors 41, 42 connected to the gates G of the transistors 60a, 60b of each module 10 are all disposed on the same side of the assembly 1, in this case on a large side.

Each module 10 has, in the example illustrated, a substrate 50 and two covers 32 disposed on either side of the substrate 50.

Figure 6:
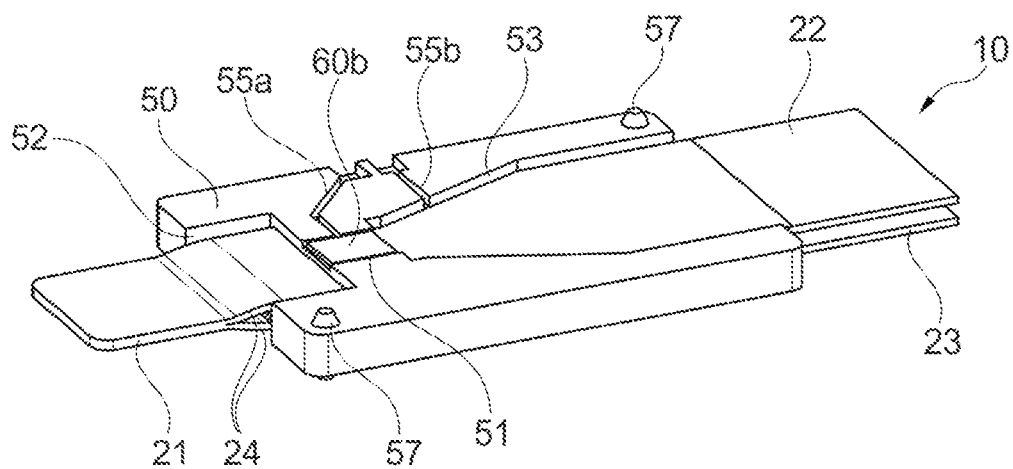
FIG. 6 shows schematically a partial perspective view of a module.
Figure 7:
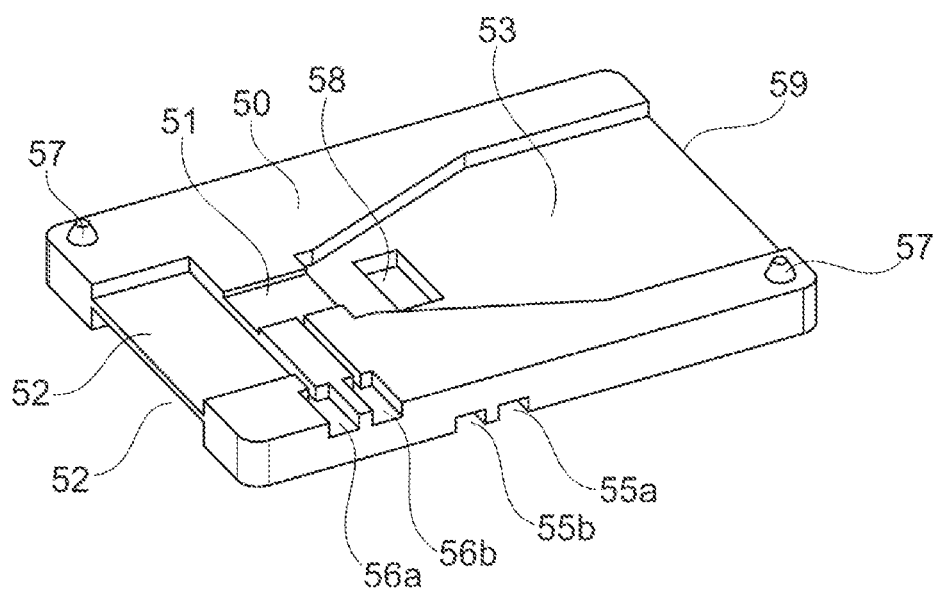
FIG. 7 shows in isolation a perspective view of the substrate of a module.
Figure 8:
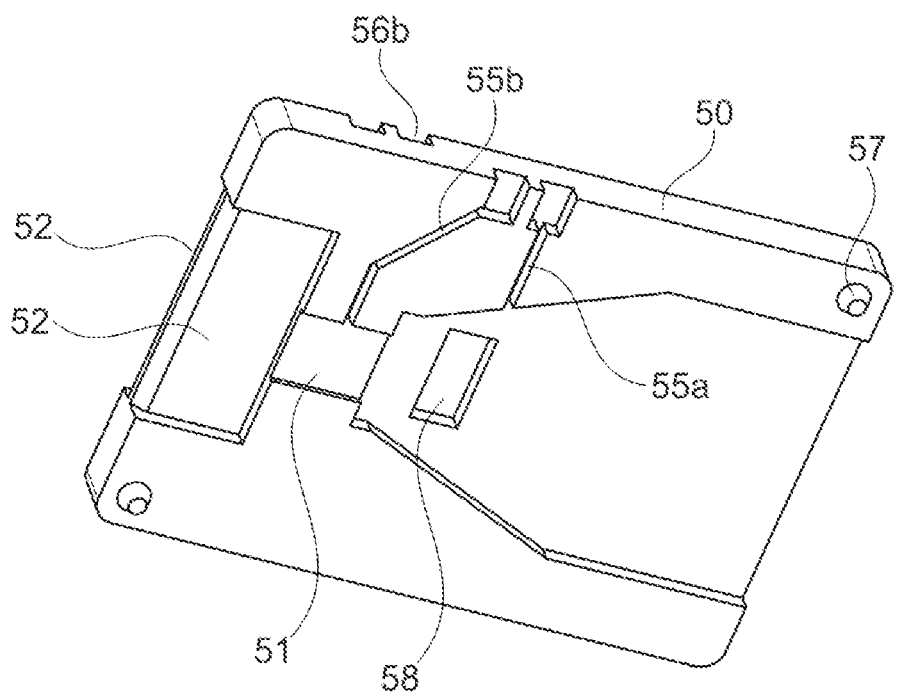
FIG. 8 is a view of the substrate in FIG. 7 from another viewing angle.

Referring to FIGS. 6 to 8, it can be seen that each substrate 50 has, on each of its main faces, an accommodation 51 for receiving a corresponding transistor 60a or 60b, and two adjacent accommodations 52 and 53 respectively opening out on the small sides of the substrate 50.

Each accommodation 52 is designed to receive one of the branches 24 of the connection element 21, whereas the accommodations 53 receive the connection elements 22 and 23, respectively.

In the example being considered, the branches 24 of the first connection element 21 are formed by respective copper strips, which come together and are assembled via their opposing faces so as to form the phase terminal.

The substrate 50 has a wall which defines the bottom of the accommodations 53 and allows the electrical isolation between the connection elements 22 and 23 to be ensured.

Figure 9:
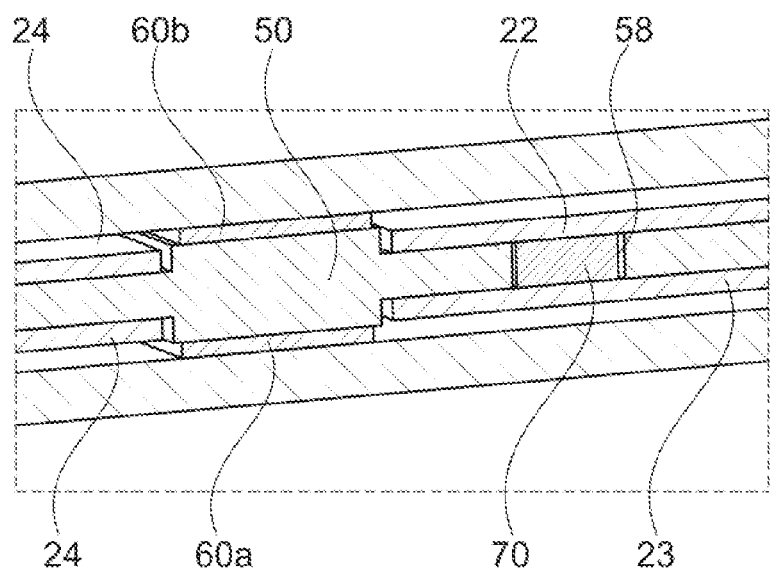
FIG. 9 is a partial cross-section of a module illustrating schematically the installation of the decoupling capacitor.

An opening 58 passes through this wall and receives the decoupling capacitor 70, as illustrated in FIG. 9.

Channels 56b and 56a are, as illustrated in FIG. 7, formed on one face of the substrate 50 for accommodating the electrical conductors respectively connected to the gate of the transistor 60a carried by this upper face and to a reference potential point (for example the potential of the source S for the upper transistor 60a of the bridge in FIG. 5). Similarly, on its opposing face, as illustrated in FIG. 8, the substrate 50 has channels 55b and 55a for respectively accommodating the conductors connected to the gate of the corresponding transistor 60b and to a reference potential point (for example the potential of the source S of the lower transistor 60b of the bridge in FIG. 5).

The accommodations 51, 52 and 53 are symmetrical in the example being considered with respect to a median plane of symmetry, passing through the substrate 50 at half-thickness. The accommodations 55a, 55b, 56a and 56b are laterally offset so as to leave between them enough space to receive the connectors 41 and 42. The connector 41 is for example connected to the conductors running in the channels 55a and 55b, whereas the connector 42 is connected to the conductors running in the channels 56a and 56b.

Features 57, for example in the form of truncated conical lugs present in diametrically opposite corners of the substrate 50, may protrude on the main faces of the substrate 50 in order to engage in corresponding holes in the covers 32 and to ensure their positioning on the substrate 50.

In FIG. 7, it can be seen that the bottom of each accommodation 51 is raised with respect to the bottom of the accommodations 52 and 53, in order to take account of the thickness of the connection elements received in these accommodations and to facilitate the electrical connection to the corresponding power contacts of the transistors 60a, 60b.

The transistors 60a, 60b are preferably designed to dissipate the heat via their external face, opposite to the substrate 50.

Figure 1:
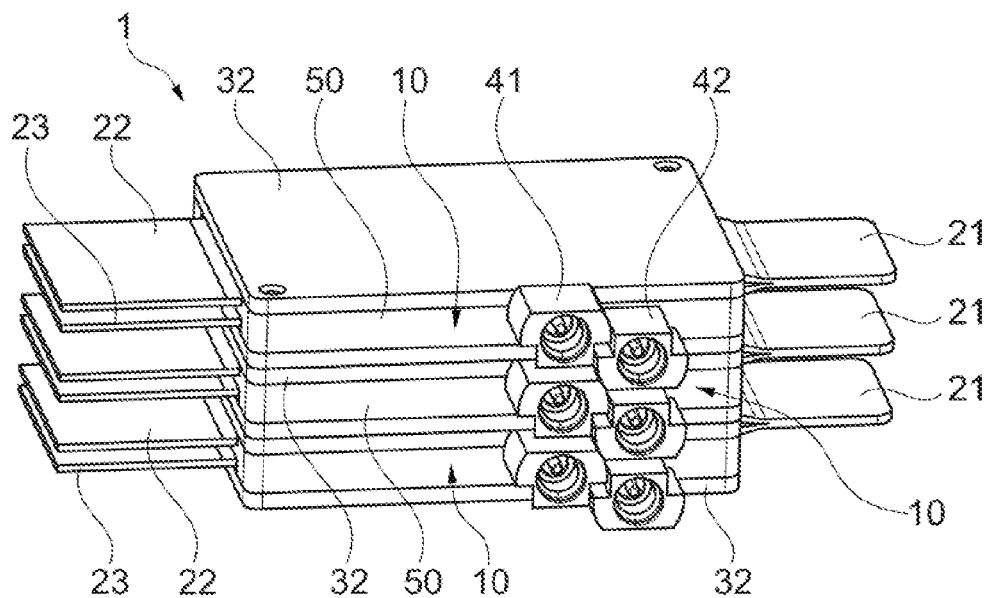
FIG. 1 is a schematic perspective view of one example of an assembly of modules according to the invention.
Figure 2:
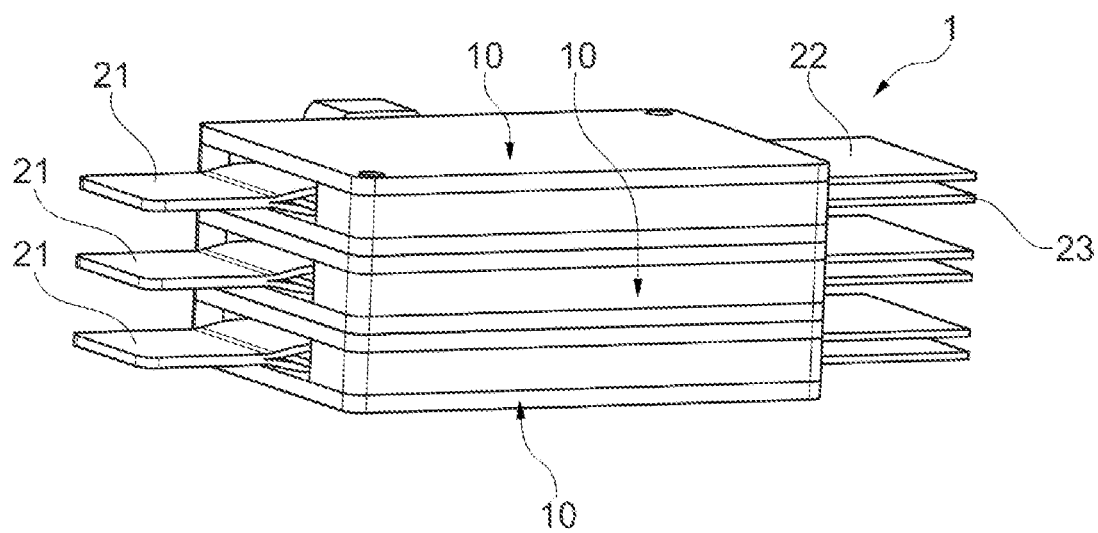
FIG. 2 shows the assembly in FIG. 1 according to another viewing angle.
Figure 3:
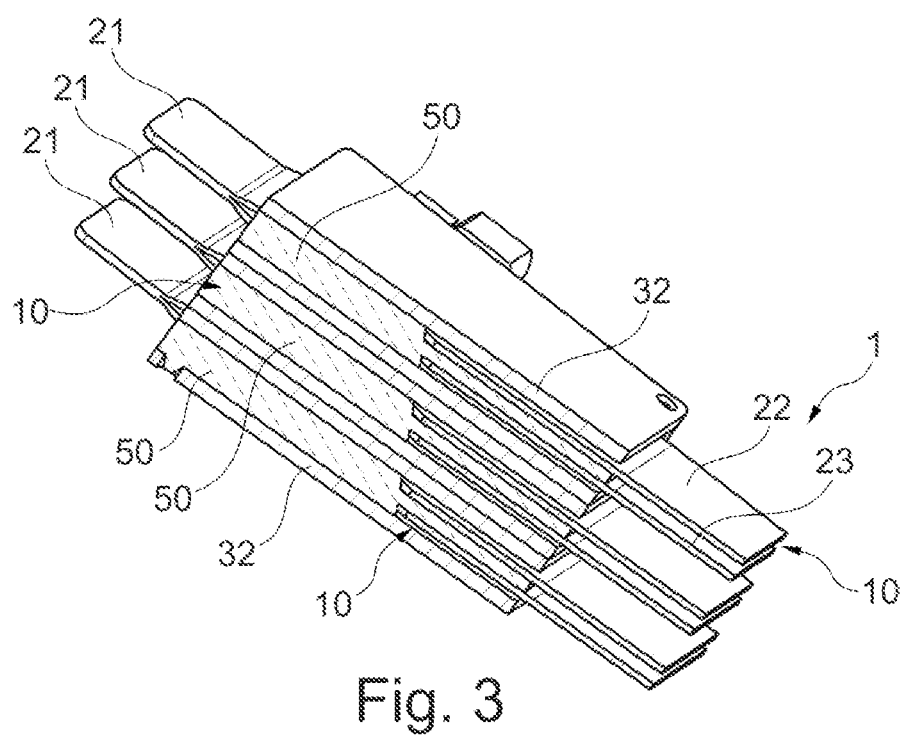
FIG. 3 shows the assembly in FIG. 1 with a cross-section through its thickness.
Figure 4:
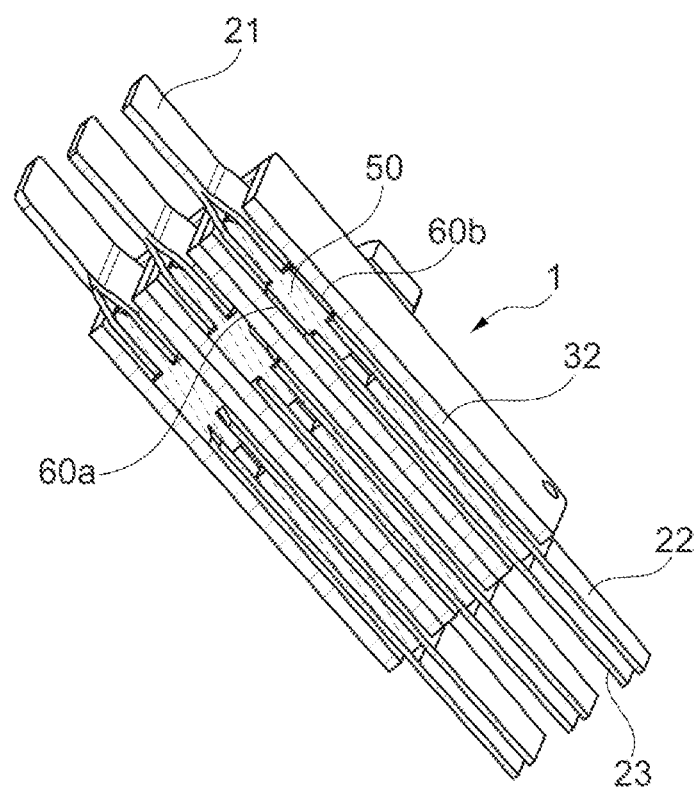
FIG. 4 is a view analogous to FIG. 3 in another cross-sectional plane.

The external face of the transistors 60a, 60b is advantageously in thermal contact with the internal face of the adjacent cover 32, as can notably be seen in FIG. 4.

The capacitor 70 has contacts which are superposed on the connection elements 22 and 23, and which provide an electrical connection with the latter.

The opening 58 is relatively close to the transistors 60a, 60b, as can be seen in FIG. 9, thus minimizing the stray inductances. The opening 58 is preferably closer to the transistors 60a, 60b than to the outer contour of the substrate 50 as seen from above, in other words when the substrate 50 is observed perpendicularly to its plane.

The connection elements 22 and 23 may have a width that decreases in the direction of the adjacent transistor 60a or 60b, as illustrated.

Figure 10:
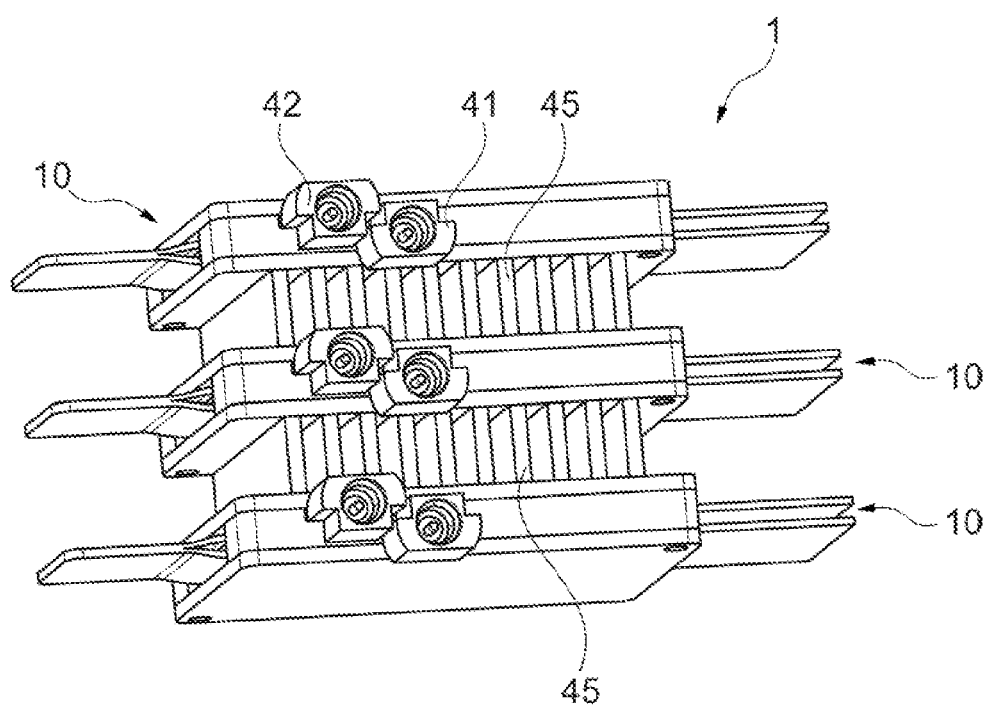
FIG. 10 is a view analogous to FIG. 1 of one variant of the assembly of modules.
Figure 11:
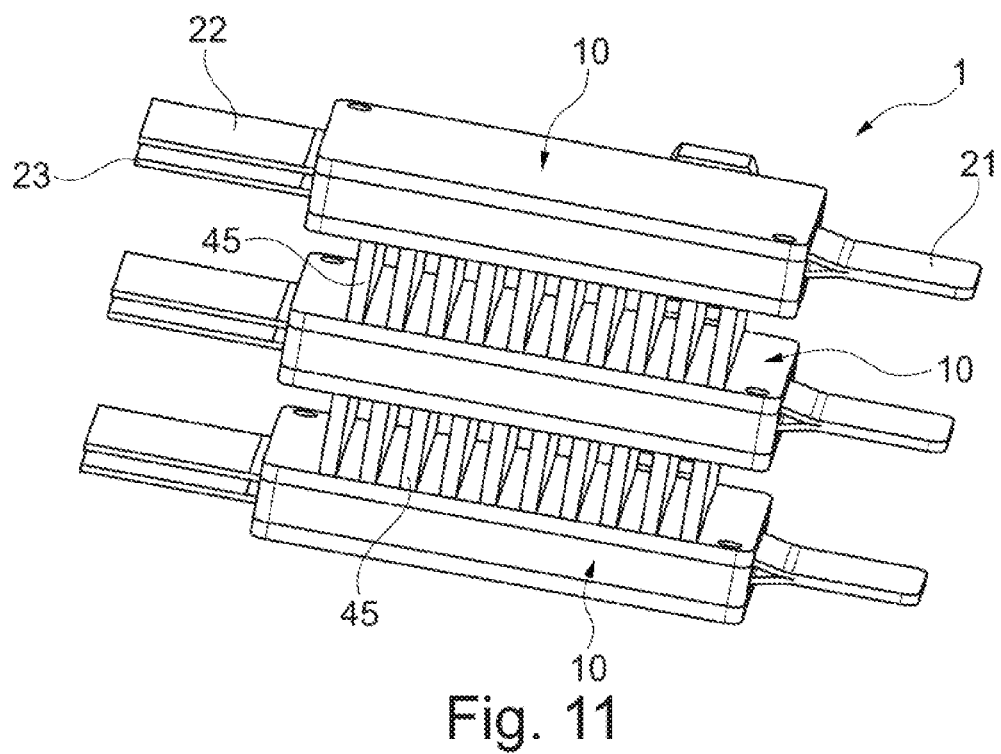
FIG. 11 shows the assembly in FIG. 10 from another viewing angle.
Figure 12:
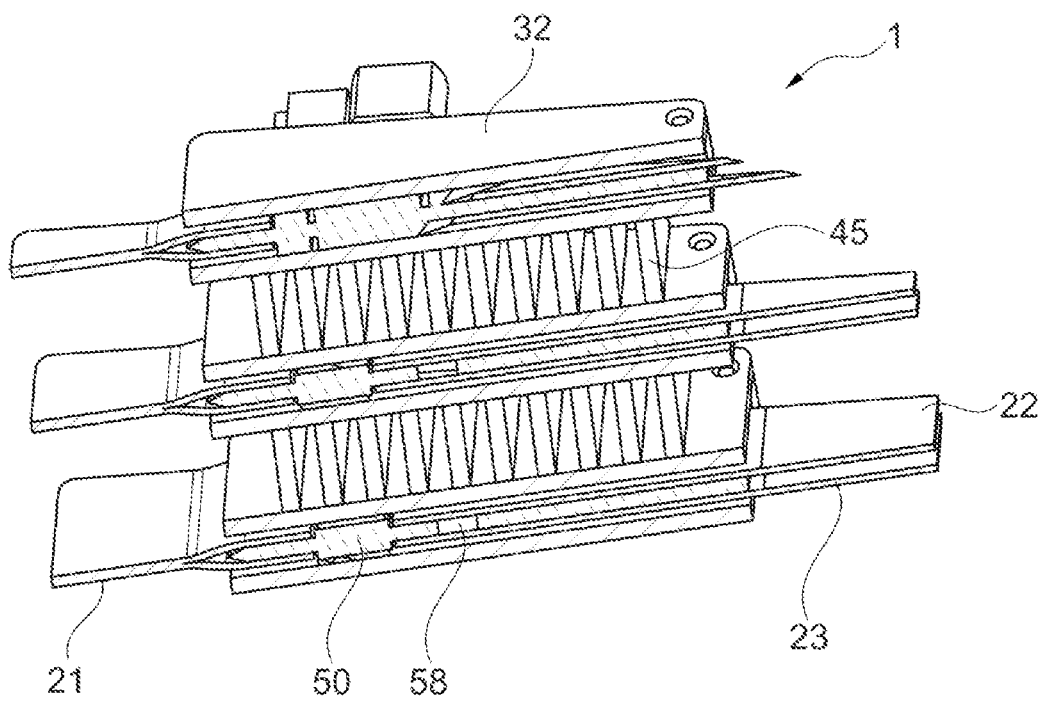
FIG. 12 is a schematic cross-section of the assembly in FIG. 10 across its thickness.

The assembly 1 may be fabricated with additional means of heat dissipation, as illustrated in FIGS. 10 to 12.

These figures show one variant of the assembly 1 in which two adjacent covers 32 of successive modules 10 are connected via cooling fins 45. The covers 32 thus connected form a double cover.

The fins 45 are for example fabricated as a single piece with the covers to which they are connected.

Means of forced convection may be provided for cooling the assembly 1, by blowing a forced flow of air between the fins 45, or as a variant by making a coolant liquid circulate between them.

It goes without saying that the invention is not limited to the examples that have just been described.

For example, numerous modifications may notably be applied to the substrate and to the connection elements.

Figure 13:
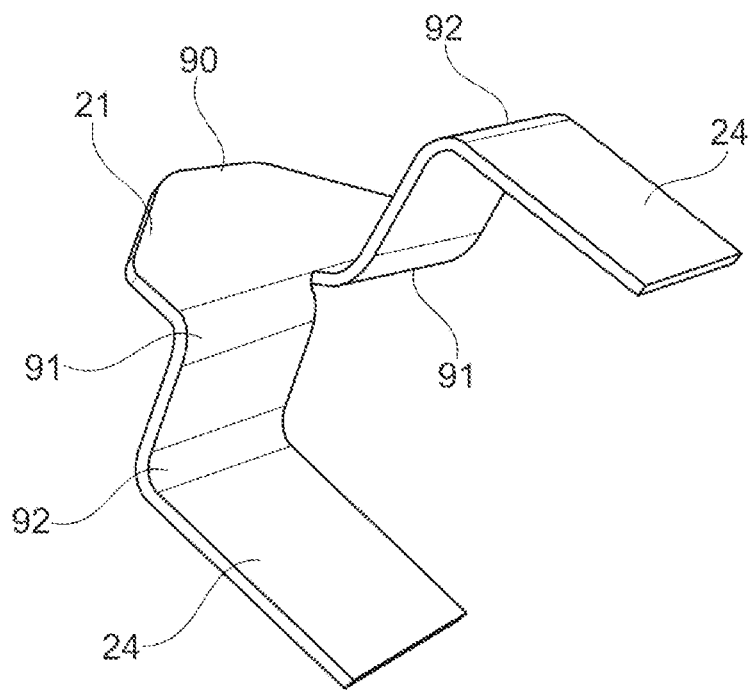
FIG. 13 shows one variant of a connection element.

For example, the first connection element 21 may be formed with a different shape, for example such as that illustrated in FIG. 13.

In this figure, it can be seen that the connection element 21 may comprise first and second branches 24 laterally offset, extending from a junction part 90 connecting the branches 24 together, each branch being connected to the junction part 90 via a first elbow 91 substantially at a right angle, the first two elbows 91 being directed in opposite directions, and each branch 24 comprising a second elbow 92 substantially at a right angle, in such a manner that the terminal portions of the first and second branches are substantially parallel, these terminal portions each being electrically connected to a power electrical contact of a transistor 60a or 60b.

In variants not illustrated, each module or a part of the latter may receive a flow of a coolant liquid.

The invention claimed is:

1. An assembly of power modules, comprising at least two superposed power modules, each power module comprising:
   an electrically insulating substrate, defining opposing main faces,
   at least a first semiconductor component and a second semiconductor component disposed one on top of the other on either side of the substrate and resting on main faces of the substrate, each component having at least two power contacts,
   a first connection element electrically connected to a first power contact of the first component and to a first power contact of the second component,
   a second connection element electrically connected to a second power contact of the first component, and
   a third connection element electrically connected to a second power contact of the second component,
   the first connection elements of the modules being disposed on the same side of the assembly,
   the second connection elements of the modules being disposed on the same side of the assembly, and
   the third connection elements of the modules being disposed on the same side of the assembly.

2. The assembly of modules according to claim 1, wherein the first connection element electrically connects the first power contact of the first component and the first power contact of the second component to each other, outside of the substrate.

3. The assembly of modules according to claim 1, wherein each component comprises at least one control contact, each module comprises at least two output terminals, and all the output terminals are situated on the same side of the module.

4. The assembly of modules according to claim 1, wherein each substrate has an opening and each module comprises a decoupling capacitor extending at least partially through the opening, being electrically connected to a power contact of one of the components and to a power contact of the other component.

5. The assembly of modules according to claim 1, wherein the substrate is monolithic.

6. The assembly of modules according to claim 1, wherein the substrate is made from a ceramic.

7. The assembly of modules according to claim 1, wherein the substrate is made with non-fully flat main faces, having at least one recessed or protruding relief for positioning the component present on one of the faces of the substrate, or for positioning a cover, or for positioning one of the connection elements.

8. The assembly of modules according to claim 1, wherein the substrate has reliefs ensuring positioning of the semiconductor components, the reliefs being arranged symmetrically with respect to a plane intersecting the substrate at mid-thickness.

9. The assembly of modules according to claim 1, wherein the first connection element is formed by cutting out and folding a foil of a metal.

10. The assembly of modules according to claim 1, wherein the first connection element comprises two superposed branches extending in contact with each other over a part of a length of the branches then separated from one another over a remainder of the length.

11. The assembly of modules according to claim 1, wherein the connection elements have parts which extend outside of the substrate and which define electrical terminals.

12. The assembly of modules according to claim 1, wherein each module comprises opposing covers in thermal contact with respective faces of the components opposite to the substrate.

13. The assembly of modules according to claim 1, wherein the two semiconductor components of each module are transistors connected together so as to form a half-bridge, or as a variant a transistor and a diode.

14. The assembly of modules according to claim 1, wherein the two components are transistors using a semiconductor with a wide bandgap such as gallium nitride.

15. The assembly of modules according to claim 1, further comprising at least one heat sink between two adjacent modules.

16. The assembly of modules according to claim 1, further comprising at least three superposed modules.

17. The assembly of modules according to claim 1, wherein
   the electrically insulating monolithic substrate of at least one power module of the at least two superposed power modules is made from a ceramic, and
   in the at least one power module, the first connection element electrically connects together the first power contact of the first component and the first power contact of the second component, outside of the ceramic substrate.

18. The assembly of modules according to claim 1, wherein
   the electrically insulating substrate of at least one power module of the at least two superposed power modules is made from a ceramic, and
   the at least one power module further comprises at least two control connectors of power components of the module, situated on the same side of the ceramic substrate.

19. The assembly of modules according to claim 1, wherein the electrically insulating substrate is made from a ceramic, the two opposing main faces each defining an accommodation in a thickness of the substrate for receiving a respective power component, an accommodation for a connection element connected to a power contact of the power component, an accommodation for another connection element connected to another power contact of the component, and at least one channel connected to a control contact of the power component, the channels for the control contacts opening out on the same side of the substrate, for the two faces of the substrate.

20. The assembly of modules according to claim 1, comprising:
a double cover comprising a first cover applied to a first substrate, made from a ceramic, of a first power module and a second cover applied to a second substrate, made from a ceramic, of a second power module, the first and second covers being rigidly attached by being fixed face against face or by being connected via fins, each cover having positioning features designed to cooperate with corresponding features of the substrate against which the cover is applied, so as to be positioned in a predefined manner on the latter, the covers having metal or metallized faces coming into contact with power components of the modules.

21. The assembly of modules according to claim 3, wherein each module comprises output terminals defined by connectors carried by the module for electrically connecting the control contacts of power components to a driver circuit.

22. The assembly of modules according to claim 4, wherein the decoupling capacitor is situated facing the second and third connection elements and in contact with the second and third connection elements.

23. The assembly of modules according to claim 9, wherein the first connection element comprises first and second branches laterally offset, extending from a junction part connecting the branches together, each branch being connected to the junction part via a first elbow substantially at a right angle, the two first elbows being directed in opposite directions, and each branch comprising a second elbow substantially at a right angle, such that terminal portions of the first and second branches are substantially parallel, the terminal portions being each electrically connected to an electrical contact of a respective component.

24. A power module according to claim 18, wherein the connectors have a plug-in direction substantially parallel to a median plane of the substrate passing through the latter at half-thickness.

25. The assembly of modules according to claim 21, wherein all the connectors are situated on the same side of the module.

26. The assembly of modules according to claim 21, wherein all the connectors are situated on the same side of the assembly of modules.

27. The assembly of modules according to claim 22, wherein the decoupling capacitor is situated close to the semiconductor components.

* * * * *